United States Patent
Kim et al.

(10) Patent No.: US 11,025,269 B2
(45) Date of Patent: Jun. 1, 2021

(54) CAPACITIVELY COUPLED CONTINUOUS-TIME DELTA-SIGMA MODULATOR AND OPERATION METHOD THEREOF

(71) Applicant: Korea University Research and Business Foundation, Seoul (KR)

(72) Inventors: Chulwoo Kim, Seoul (KR); Chae Kang Lim, Incheon (KR); Yo Han Choi, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/871,082

(22) Filed: May 11, 2020

(65) Prior Publication Data
US 2020/0366311 A1   Nov. 19, 2020

(30) Foreign Application Priority Data
May 13, 2019   (KR) .......................... 10-2019-0055437

(51) Int. Cl.
*H03M 3/00*   (2006.01)
*H03F 3/04*   (2006.01)

(52) U.S. Cl.
CPC ............. *H03M 3/322* (2013.01); *H03F 3/04* (2013.01); *H03M 3/422* (2013.01); *H03F 2200/261* (2013.01)

(58) Field of Classification Search
CPC ......... H03M 3/322; H03M 3/422; H03F 3/04; H03F 2200/261
USPC .......................... 341/120, 118, 143, 144, 155
See application file for complete search history.

(56) References Cited

U.S. PATENT DOCUMENTS

| | | | | |
|---|---|---|---|---|
| 7,714,757 | B2 * | 5/2010 | Denison | A61B 5/04012 341/143 |
| 8,120,422 | B1 | 2/2012 | Huijsing et al. | |
| 9,595,922 | B2 | 3/2017 | Maderbacher et al. | |
| 10,097,146 | B2 * | 10/2018 | Stan | H03F 3/387 |
| 2008/0272757 | A1 * | 11/2008 | Melanson | H02M 1/4225 323/282 |

(Continued)

FOREIGN PATENT DOCUMENTS

JP   2019-012045 A   1/2019

OTHER PUBLICATIONS

Wu et al., "A Chopper Current-Feedback Instrumentation Amplifier With a 1 mHz 1/f Noise Corner and an AC-Coupled Ripple Reduction Loop," IEEE Journal of Solid-State Circuits, vol. 44, No. 12, Dec. 2009, pp. 3232-3243.

*Primary Examiner* — Peguy Jean Pierre
(74) *Attorney, Agent, or Firm* — NSIP Law

(57) ABSTRACT

According to an exemplary embodiment, a capacitively coupled continuous-time delta-sigma modulator includes an instrumentation amplifier amplifying an input voltage to an output voltage of a predetermined magnitude, a delta-sigma modulator outputting a bit signal quantized depending on a sampling frequency based on the output voltage and to convert the bit signal into a digital-to-analog conversion voltage, and a ripple reduction loop unit generating a demodulation voltage, in which a ripple is removed from the output voltage, depending on an RRL operating frequency to feed the demodulation voltage back to the instrumentation amplifier. The RRL operating frequency is equal to the sampling frequency.

18 Claims, 4 Drawing Sheets

(56) References Cited

U.S. PATENT DOCUMENTS

2018/0091103 A1\* 3/2018 Stan ............... H03F 3/387
2019/0079143 A1 3/2019 Romero et al.

\* cited by examiner

CAPACITIVELY COUPLED CONTINUOUS-TIME DELTA-SIGMA MODULATOR AND OPERATION METHOD THEREOF

CROSS-REFERENCE TO RELATED APPLICATIONS

This application claims priority under 35 U.S.C. § 119 to Korean Patent Application No. 10-2019-0055437 filed on May 13, 2019, in the Korean Intellectual Property Office, the disclosures of which are incorporated by reference herein in their entireties.

BACKGROUND

Embodiments of the inventive concept described herein relate to a capacitively coupled continuous-time delta-sigma modulator and an operation method thereof, and more particularly, relate to a capacitively coupled continuous-time delta-sigma modulator using an instrumentation amplifier and a delta-sigma modulator and an operation method thereof.

The modulator of a sensor interface using an instrumentation amplifier and a delta-sigma modulator may reduce the low-frequency noise of an input signal using a chopper.

At this time, because the chopper generates ripple during a modulation operation, the modulator of the sensor interface may reduce the ripple using a ripple reduction loop (RRL).

However, the modulator of the sensor interface including the RRL increases a noise floor due to quantization noise demodulation occurring in the delta-sigma modulator, and reduces stability by generating noise peaking in a noise transfer function (NTF).

SUMMARY

Embodiments of the inventive concept provide a capacitively coupled continuous-time delta-sigma modulator capable of reducing the noise peaking of NTF while preventing quantization noise demodulation of a delta-sigma modulator, which is generated by removing ripple.

According to an exemplary embodiment, a capacitively coupled continuous-time delta-sigma modulator includes an instrumentation amplifier amplifying an input voltage to an output voltage of a predetermined magnitude, a delta-sigma modulator outputting a bit signal quantized depending on a sampling frequency based on the output voltage and to convert the bit signal into a digital-to-analog conversion voltage, and a ripple reduction loop unit generating a demodulation voltage, in which a ripple is removed from the output voltage, depending on an RRL operating frequency to feed the demodulation voltage back to the instrumentation amplifier. The RRL operating frequency is equal to the sampling frequency.

In an embodiment, the instrumentation amplifier includes a first modulator modulating the input voltage depending on a modulation frequency equal to the sampling frequency, a second modulator modulating at least one of an output of the first modulator and the demodulation voltage depending on the modulation frequency, and a third modulator modulating the output voltage depending on the modulation frequency.

In an embodiment, the ripple reduction loop unit feeds the demodulation voltage back to the second modulator.

In an embodiment, the ripple reduction loop unit includes a loop sensing capacitor sensing the output voltage, a ripple elimination demodulator demodulating a charging voltage, which is charged through the loop sensing capacitor, as a first demodulation voltage depending on the RRL operating frequency, a ripple elimination inverting amplifier inverting and amplifying the first demodulation voltage, a loop feedback capacitor feeding an output terminal of the ripple elimination inverting amplifier back to an inverting input terminal of the ripple elimination inverting amplifier, and a ripple elimination non-inverting amplifier non-inverting and amplifying the inverted and amplified first demodulation voltage as the demodulation voltage depending on a transconductance. The inverted and amplified first demodulation voltage is non-inverted and amplified as the demodulation voltage depending on the transconductance of the ripple elimination non-inverting amplifier.

In an embodiment, a capacitance of the loop sensing capacitor is preset to a value reduced at a first decrease ratio based on a preset target increase ratio of a signal-to-noise ratio.

In an embodiment, the transconductance is preset to a value reduced at a second decrease ratio based on the preset target increase ratio of the signal-to-noise ratio, and the second decrease ratio is less than the first decrease ratio.

In an embodiment, the instrumentation amplifier further includes a first amplifier, of which an input terminal is electrically connected to a first capacitor coupled to the first modulator and a second amplifier, of which an input terminal is connected to the second modulator and of which an output terminal is connected to a second capacitor. The input terminal of the second amplifier and the output terminal of the second amplifier are electrically connected through the second capacitor, and the output terminal of the second amplifier is electrically connected to the input terminal of the first amplifier through a third capacitor coupled to the third modulator.

In an embodiment, the delta-sigma modulator includes a loop filter connected to the output terminal of the second amplifier and performing low pass filtering on the output voltage depending on a preset loop transfer function, a quantizer quantizing the low-pass-filtered output voltage as the bit signal, and a digital-to-analog converter converting the bit signal into the digital-to-analog conversion voltage to feed the digital-to-analog conversion voltage back to the input terminal of the first amplifier.

In an embodiment, the preset loop transfer function includes a gain value corresponding to NULL for each sampling frequency.

According to an exemplary embodiment, an operation method of a capacitively coupled continuous-time delta-sigma modulator includes amplifying, by an instrumentation amplifier, an input voltage to an output voltage of a predetermined magnitude, outputting, by a delta-sigma modulator, a bit signal quantized depending on a sampling frequency based on the output voltage, converting, by the delta-sigma modulator, the bit signal into a digital-to-analog conversion voltage, and generating, by a ripple reduction loop unit, a demodulation voltage, in which a ripple is removed from the output voltage, depending on an RRL operating frequency equal to the sampling frequency to feed the demodulation voltage back to the instrumentation amplifier.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
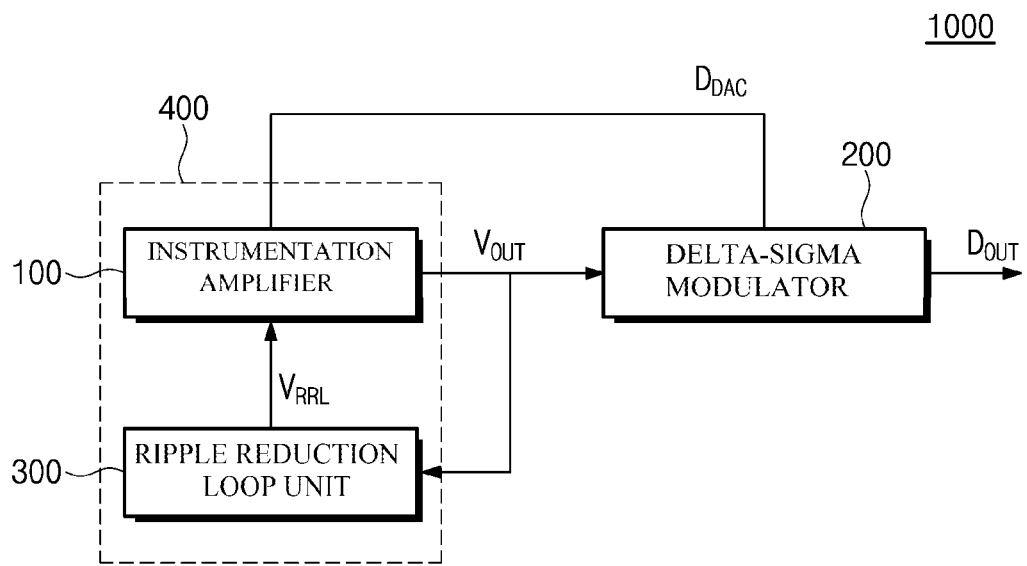
FIG. 1 is a block diagram of a capacitively coupled continuous-time delta-sigma modulator according to an embodiment of the inventive concept.

With regard to various embodiments according to the inventive concept disclosed in this specification, specific structural or functional descriptions are exemplified only for the purpose of describing embodiments according to the inventive concept, and the embodiments according to the inventive concept may be implemented in various different forms, not limiting the embodiments described in this specification.

While the inventive concept is susceptible to various modifications and alternative forms, specific embodiments thereof are shown by way of example in the drawings and will herein be described in detail. However, it should be understood that there is no intent to limit the inventive concept to the particular forms disclosed, but on the contrary, the invention is to cover all modifications, equivalents, and alternatives falling within the spirit and scope of the inventive concept.

It will be understood that, even though the terms "first," "second," "A," "B," etc. may be used herein in reference to elements of the invention, such elements should not be construed as being limited by these terms. These terms are only used to distinguish one element from another. For example, a first element could be termed as a second element, and, similarly, a second element could be termed as a first element, without departing from the scope of the inventive concept.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe embodiments of the inventive concept is not intended to limit the scope of the inventive concept. The terms of a singular form may include plural forms unless otherwise specified. It will be further understood that the terms "comprises," "comprising," "includes," and/or "including," when used herein, specify the presence of stated features, numbers, steps, operations, elements, and/or components, but do not preclude the presence or addition of one or more other features, numbers, steps, operations, elements, components, and/or groups thereof.

Furthermore, unless otherwise defined, all terms including technical and scientific terms used herein are to be interpreted as is customary in the art to which this inventive concept belongs. It will be further understood that terms used herein should be interpreted as having a meaning that is consistent with their meaning in the context of the inventive concept and the relevant art and will not be interpreted in an idealized or overly formal sense unless expressly so defined herein.

Hereinafter, the inventive concept will be described in detail by describing preferred embodiments of the inventive concept with reference to the accompanying drawings.

Figure 2:
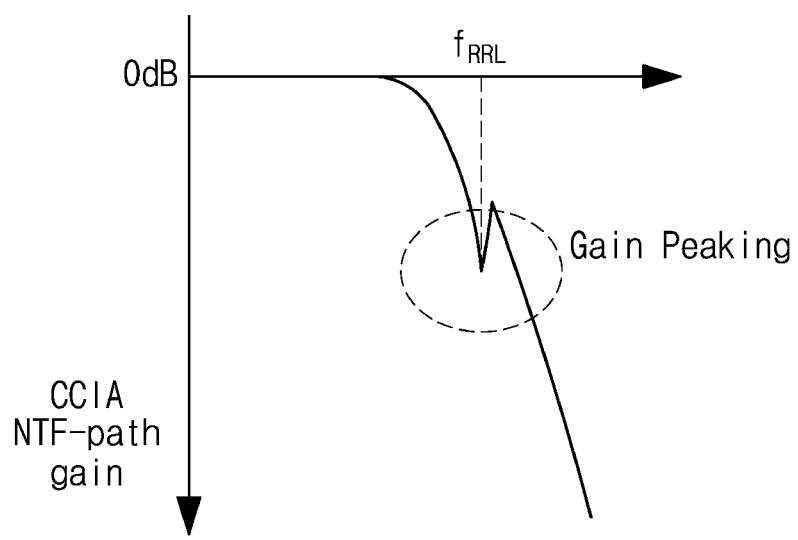
FIG. 2 is a diagram illustrating a TF for a capacitively coupled instrumentation amplifier.
Figure 3:
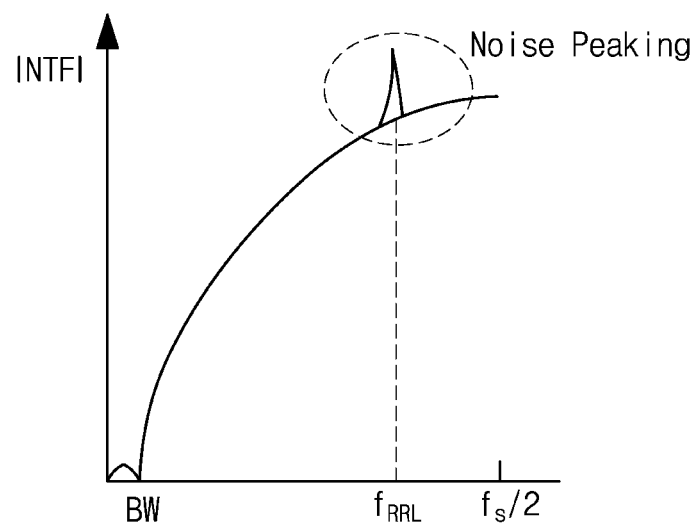
FIG. 3 is a diagram illustrating a NTF for a delta-sigma modulator modified depending on the TF of FIG. 2.
Figure 4:
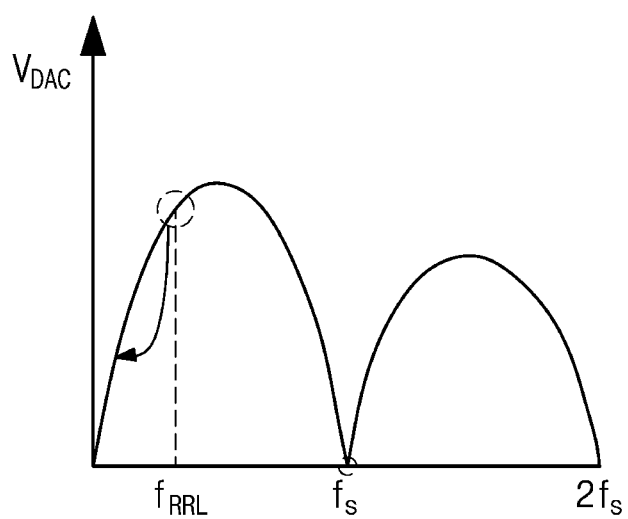
FIG. 4 is a diagram illustrating a magnitude of a digital-to-analog conversion voltage $V_{DAC}$ output for each frequency band.

FIG. 1 is a block diagram of a capacitively coupled continuous-time delta-sigma modulator 1000 according to an embodiment of the inventive concept. FIG. 2 is a diagram illustrating a transfer function (TF) for a capacitively coupled instrumentation amplifier 400. FIG. 3 is a diagram illustrating a NTF for a delta-sigma modulator 200 modified depending on the TF of FIG. 2. FIG. 4 is a diagram illustrating a magnitude of a digital-to-analog conversion voltage $V_{DAC}$ output for each frequency band.

Referring to FIG. 1, the capacitively coupled continuous-time delta-sigma modulator 1000 may include an instrumentation amplifier 100, the delta-sigma modulator 200, and a ripple reduction loop unit 300.

First of all, the instrumentation amplifier 100 may amplify an input voltage $V_{IN}$ to an output voltage $V_{OUT}$ of a predetermined magnitude. In particular, the instrumentation amplifier 100 may amplify the input voltage $V_{IN}$ to the output voltage $V_{OUT}$ of a predetermined magnitude through at least one modulator (e.g., 111 to 113) and an amplifier (e.g., 121 and 122) to be described later in FIG. 7.

At this time, the instrumentation amplifier 100 may reduce the low-frequency noise for the input voltage $V_{IN}$ by performing a modulation operation at least twice or more on the input voltage $V_{IN}$ depending on a modulation frequency $f_M$.

Next, the delta-sigma modulator 200 may output a bit signal $D_{OUT}$ quantized based on the output voltage $V_{OUT}$ depending on a sampling frequency $f_s$. Herein, the bit signal $D_{OUT}$ may be a pulse train corresponding to a digital signal. In particular, because the input side of the delta-sigma modulator 200 is electrically connected to the output side of the instrumentation amplifier 100, and thus the output voltage $V_{OUT}$ received from the instrumentation amplifier 100 is quantized as a bit signal $D_{OUT}$ depending on the sampling frequency $f_s$ the delta-sigma modulator 200 may be referred to as an "oversampling analog-to-digital converter (ADC)".

At this time, the delta-sigma modulator 200 converts the bit signal $D_{OUT}$ quantized depending on the sampling frequency $f_s$ into a digital-to-analog conversion voltage $V_{DAC}$ through digital-to-analog conversion, and may feed the digital-to-analog conversion voltage VDAC back to the input side of the instrumentation amplifier 100. Accordingly, the delta-sigma modulator 200 may saturate the output side of the instrumentation amplifier 100 due to the ripple generated depending on the modulation operation of the instrumentation amplifier 100.

In the technical spirit according to an embodiment of the inventive concept, the ripple reduction loop unit 300 may generate a demodulation voltage $V_{RRL}$ demodulated depending on an RRL operating frequency $f_{RRL}$ from the output voltage $V_{OUT}$ and feed the demodulation voltage $V_{RRL}$ back to the instrumentation amplifier 100.

Herein, the demodulation voltage $V_{RRL}$ may be a voltage in which the ripple in the high-frequency band is removed from the output voltage $V_{OUT}$. That is, the ripple reduction loop unit 300 may feed the demodulation voltage $V_{RRL}$, in which the ripple in the high-frequency band is removed, to the instrumentation amplifier 100, thereby reducing the ripple generated depending on the modulation operation of the instrumentation amplifier 100.

At this time, the RRL operating frequency $f_{RRL}$ may be the same frequency as the sampling frequency $f_s$ of the delta-sigma modulator 200. That is, the ripple reduction loop unit 300 may generate the demodulation voltage $V_{RRL}$ demodulated depending on the RRL operating frequency $f_{RRL}$ the same as the sampling frequency $f_s$ and feeds the demodulation voltage $V_{RRL}$ back to the instrumentation amplifier 100, thereby preventing the deformation of NTF of the delta-sigma modulator 200 and preventing the damage to Signal-to-Quantization Noise Ratio (SQNR).

Hereinafter, to specifically describe the effect of preventing the delta-sigma modulator 200 from deforming the NTF and preventing damage to the SQNR, the capacitively coupled instrumentation amplifier (CCIA) 400 will be described with reference to FIGS. 2 to 4.

In this inventive concept, the CCIA 400 includes the ripple reduction loop unit 300 and the instrumentation amplifier 100, which are configurations separated from each other; according to an embodiment, the CCIA 400 may be referred to as the instrumentation amplifier 100 equipped with the ripple reduction loop unit 300. In particular, because the CCIA 400 includes the ripple reduction loop unit 300 and the instrumentation amplifier 100, the CCIA 400 may be expressed as a TF indicating the gain for each frequency between the demodulation voltage $V_{RLL}$ and the output voltage $V_{OUT}$.

As illustrated in FIG. 2, the TF for the CCIA 400 may generate gain peaking by the demodulation voltage $V_{RLL}$ demodulated at the RRL operating frequency $f_{RRL}$. Because the output side of the CCIA 400 is electrically connected to the input side of the delta-sigma modulator 200 and the output side of the delta-sigma modulator 200 is electrically connected to the input side of the CCIA 400, the gain peaking generated depending on the demodulation voltage $V_{RLL}$ may allow the NTF for the delta-sigma modulator 200 to be deformed.

As illustrated in FIG. 3, the NTF for the delta-sigma modulator 200 may generate noise peaking (NTF Peaking) corresponding to the gain peaking of TF. Herein, noise peaking (NTF Peaking) may reduce the stability of the delta-sigma modulator 200.

As illustrated in FIG. 4, when the RRL operating frequency $f_{RRL}$ is less than the sampling frequency $f_s$, the high-frequency component of the digital-to-analog conversion voltage $V_{DAC}$ is demodulated and entered in a low-frequency signal band, thereby damaging the SQNR.

According to an embodiment, when the sampling frequency $f_s$ and the RRL operating frequency $f_{RRL}$ are the same as each other, as illustrated in FIG. 4, the digital-to-analog conversion voltage $V_{DAC}$ is very small at the sampling frequency $f_s$, and thus the ripple reduction loop unit 300 may restrict the shaped quantization noise formed by the delta-sigma modulator 200. At this time, because the shaped quantization noise demodulated in a signal band is restricted, the SQNR is not damaged.

Figure 5:
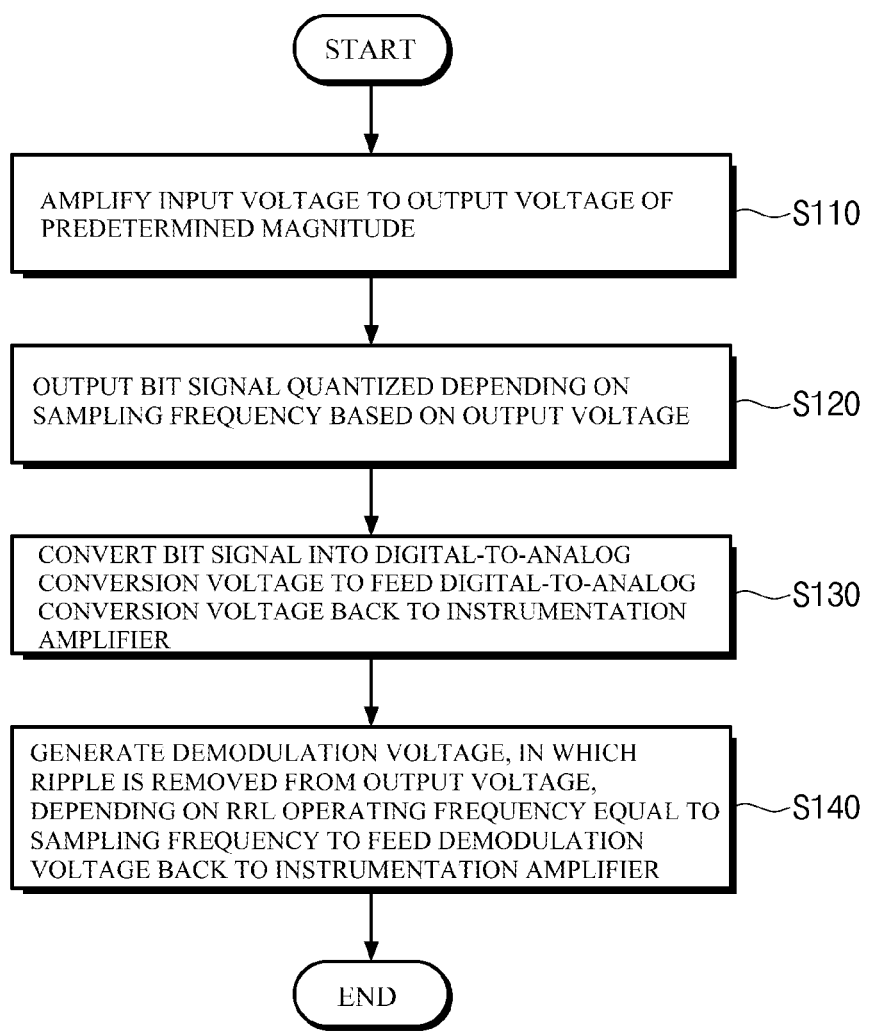
FIG. 5 is an operation process for a capacitively coupled continuous-time delta-sigma modulator of FIG. 1.

FIG. 5 is an operation process for the capacitively coupled continuous-time delta-sigma modulator 1000 of FIG. 1.

Referring to FIGS. 1 and 5, first of all, in operation S110, the instrumentation amplifier 100 may amplify an input voltage $V_{IN}$ to an output voltage $V_{OUT}$ of a predetermined magnitude.

Next, in operation S120, the delta-sigma modulator 200 may output a bit signal $D_{OUT}$ quantized depending on a sampling frequency, based on the output voltage $V_{OUT}$.

Then, in operation S130, the delta-sigma modulator 200 may convert the bit signal $D_{OUT}$ into a digital-to-analog conversion voltage $V_{DAC}$ to feed the digital-to-analog conversion voltage $V_{DAC}$ back to the instrumentation amplifier 100.

Afterward, in operation S140, the ripple reduction loop unit 300 generates a demodulation voltage $V_{RRL}$, in which the ripple is removed from the output voltage $V_{OUT}$, depending on the RRL operating frequency $f_{RRL}$ the same as the sampling frequency, and then may feed the demodulation voltage $V_{RRL}$ back to the instrumentation amplifier 100.

Hereinafter, the ripple reduction loop unit 300 will be described in more detail with reference to FIG. 6.

Figure 6:
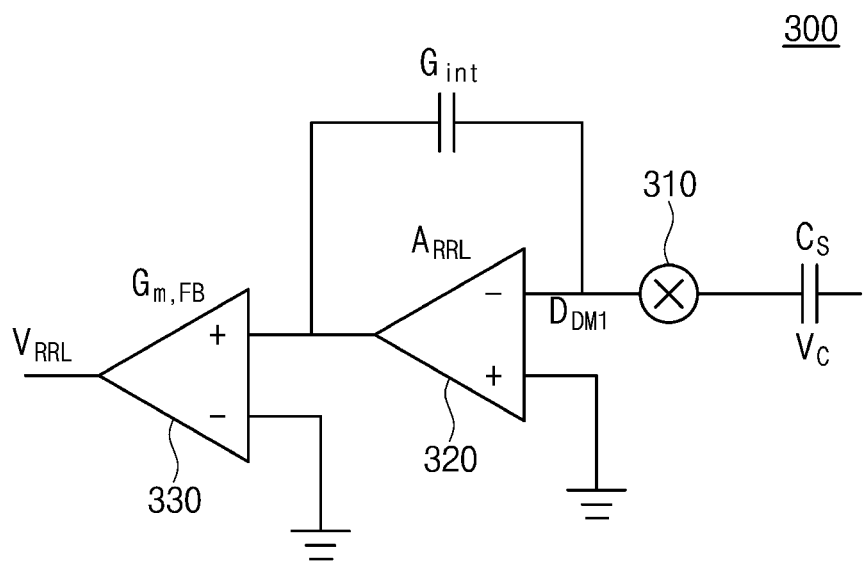
FIG. 6 is a block diagram of a ripple reduction loop unit of FIG. 1.

FIG. 6 is a block diagram of the ripple reduction loop unit 300 of FIG. 1.

Referring to FIG. 6, the ripple reduction loop unit 300 may include a ripple elimination demodulator 310, a ripple elimination inverting amplifier 320, and a ripple elimination non-inverting amplifier 330.

First of all, the ripple elimination demodulator 310 may be coupled to a loop sensing capacitor $C_S$ connected between the instrumentation amplifier 100 and the delta-sigma modulator 200 and may demodulate a charging voltage $V_C$ charged through the loop sensing capacitor $C_S$ to a first demodulation voltage $V_{DM1}$ depending on the RRL operating frequency $f_{RRL}$. Herein, the first demodulation voltage $V_{DM1}$ may be a low-frequency band voltage for demodulating the output voltage $V_{OUT}$ positioned at the RRL operating frequency $f_{RRL}$ in a low-frequency band. At this time, the ripple elimination demodulator 310 may output the first demodulation voltage $V_{DM1}$ to an inverting input terminal of the ripple elimination inverting amplifier 320.

In particular, one side of the loop sensing capacitor $C_S$ may be connected to an output terminal of the instrumentation amplifier 100 and an input terminal of the delta-sigma modulator 200, and the other side may be connected to the ripple elimination demodulator 310. Furthermore, the loop sensing capacitor $C_S$ may deliver a charging voltage proportional to the capacitance to the ripple elimination demodulator 310 based on the output voltage $V_{OUT}$ output from the instrumentation amplifier 100 to the delta-sigma modulator 200.

At this time, the capacitance of the loop sensing capacitor $C_S$ may be preset to the value reduced at a first decrease ratio based on a target increase ratio of a signal-to-noise ratio (SNR) of the capacitively coupled continuous-time delta-sigma modulator 1000. For example, when the target increase ratio of the SNR of the capacitively coupled continuous-time delta-sigma modulator 1000 is 1.1 times, the capacitance of the loop sensing capacitor $C_S$ may be preset to the value reduced at the first decrease rate, which is 0.25 times based on the target increase rate of 1.1 times.

Next, the inverting input terminal of the ripple elimination inverting amplifier 320 is electrically connected to the output terminal of the ripple elimination inverting amplifier 320 through a feedback capacitor $C_{INT}$, and the inverting input terminal is electrically connected to the ripple elimination demodulator 310; accordingly, the ripple elimination inverting amplifier 320 may invert and amplify the first demodulation voltage $V_{DM1}$ modulated through the ripple elimination demodulator 310.

Next, the non-inverting input terminal of the ripple elimination non-inverting amplifier 330 is electrically connected to the output terminal of the ripple elimination inverting amplifier 320, and thus the ripple elimination non-inverting amplifier 330 may amplify the first demodulation voltage $V_{DM1}$, which is inverted and amplified through the ripple elimination inverting amplifier 320, as the demodulation voltage $V_{RRL}$ depending on a transconductance $G_{m,FB}$. At this time, the ripple elimination non-inverting amplifier 330 may feed the amplified demodulation voltage $V_{RRL}$ back to the instrumentation amplifier 100.

At this time, the transconductance $G_{m,FB}$ of the ripple elimination non-inverting amplifier 330 may be preset to the value reduced at a second decrease ratio based on a target increase ratio of the SNR of the capacitively coupled continuous-time delta-sigma modulator 1000. Herein, the second decrease ratio may be less than the first decrease ratio. For example, when the target increase ratio of the SNR of the capacitively coupled continuous-time delta-sigma modulator 1000 is 1.1 times, the transconductance $G_{m,FB}$ may be preset to the value reduced at the second decrease rate, which is 0.125 times based on the target increase rate of 1.1 times.

Hereinafter, the instrumentation amplifier 100 and the delta-sigma modulator 200 of FIG. 1 will be described in more detail with reference to FIG. 7.

Figure 7:
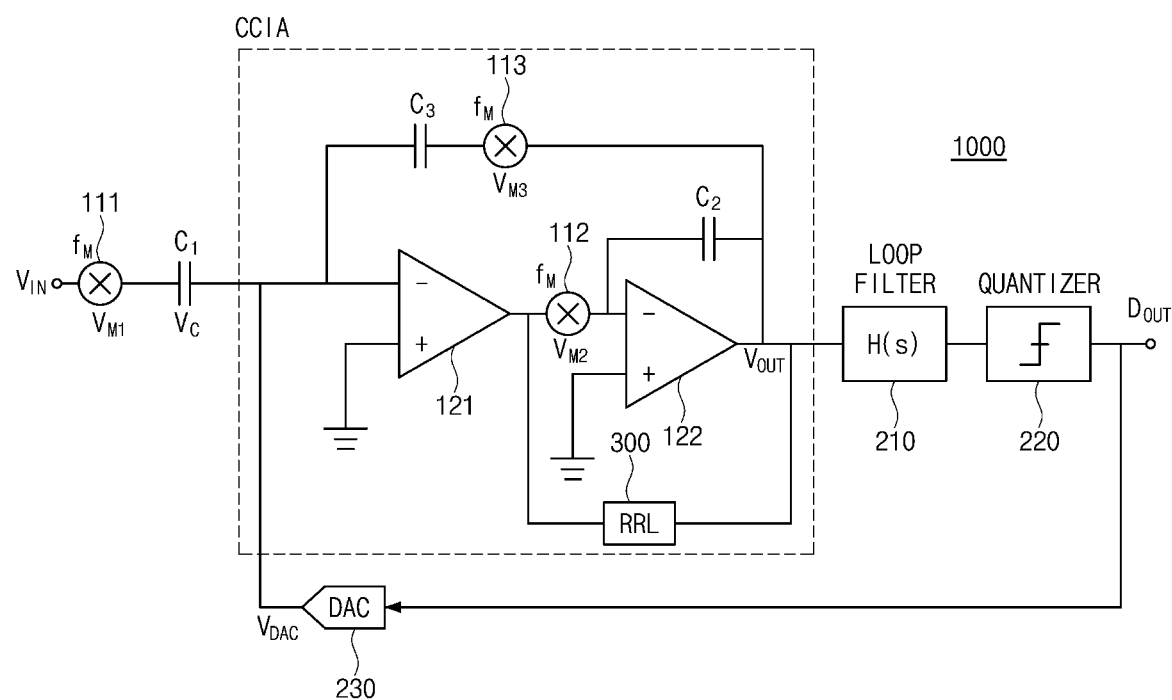
FIG. 7 is a circuit diagram specifically illustrating an instrumentation amplifier and a delta-sigma modulator of FIG. 1.

FIG. 7 is a circuit diagram specifically illustrating the instrumentation amplifier 100 and the delta-sigma modulator 200 of FIG. 1.

Referring to FIG. 7, the instrumentation amplifier 100 may include first to third modulators 111 to 113, and first and second amplifiers 121 and 122.

First of all, the first modulator 111 may receive the input voltage $V_{IN}$ and may modulate the input voltage $V_{IN}$ as a first modulation voltage $V_{M1}$ depending on a modulation frequency $f_M$. Herein, because the modulation frequency $f_M$ is the same as the sampling frequency $f_s$, the modulation frequency $f_M$ may be the same as the RRL operating frequency $f_{RRL}$. In this case, the first modulation voltage $V_{M1}$ may be the input voltage $V_{IN}$ modulated with the modulation frequency $f_M$.

Next, the inverting input terminal of the first amplifier 121 may be electrically connected to a first capacitor $C_1$ coupled to the first modulator 111, and thus the first amplifier 121 may amplify the first modulation voltage $V_{M1}$ modulated through the first modulator 111. Furthermore, the first amplifier 121 may receive the feedback on the digital-to-analog conversion voltage $V_{DAC}$ from the delta-sigma modulator 200 through the inverting input terminal.

Next, the input side of the second modulator 112 may be electrically connected to the first amplifier 121 and the ripple reduction loop unit 300, and thus the second modulator 112 may receive the first modulation voltage $V_{M1}$ amplified through the first amplifier 121 and the demodulation voltage $V_{RRL}$ fed back through the ripple reduction loop unit 300.

At this time, the second modulator 112 may modulate at least one of the first modulation voltage $V_{M1}$ and the demodulation voltage $V_{RRL}$ to a second modulation voltage $V_{M2}$ depending on the modulation frequency $f_M$. Herein, the second modulation voltage $V_{M2}$ may be at least one of the first modulation voltage $V_{M1}$ modulated with the modulation frequency $f_M$ and the demodulation voltage $V_{RRL}$.

Next, the input terminal of the second amplifier 122 electrically connected to the output terminal through the second capacitor $C_2$ is connected to the second modulator 112, and thus the second amplifier 122 may amplify the second modulation voltage $V_{M2}$, which is modulated through the second modulator 112 as an output voltage $V_{OUT}$ of a preset magnitude.

Next, the third modulator 113 may modulate the output voltage $V_{OUT}$ amplified through the second amplifier 122 to a third modulation voltage $V_{M3}$ depending on the modulation frequency $f_M$, and then may feed the third modulation voltage $V_{M3}$ back to the input terminal of the first amplifier 121 coupled to a third capacitor $C_3$. Herein, the third modulation voltage $V_{M3}$ may be the output voltage $V_{OUT}$ modulated with the modulation frequency $f_M$. At this time, the third modulator 113 may feed the output voltage $V_{OUT}$ back to the input terminal of the first amplifier 121 through the third capacitor $C_3$ coupled to the inverting input terminal to the first amplifier 121.

Next, the delta-sigma modulator 200 may include a loop filter 210, a quantizer 220, and a digital-to-analog converter 230.

In particular, the loop filter 210 may be connected to the output terminal of the second amplifier 122 to receive the output voltage $V_{OUT}$ and then may perform low-pass filtering on the output voltage $V_{OUT}$ depending on a predetermined loop transfer function H(S). Herein, the predetermined loop transfer function H(S) may include a gain value corresponding to NULL for each sampling frequency.

For example, when the capacitance of the loop sensing capacitor $C_S$ and the transconductance $G_{m,FB}$ of the ripple elimination non-inverting amplifier 330 are set to be less than a predetermined value, the loop filter 210 may perform low-pass filtering on the output voltage $V_{OUT}$ to remove the ripple for the output voltage $V_{OUT}$, depending on the gain value corresponding to NULL for each sampling frequency.

Next, the quantizer 220 may quantize and output the low-pass-filtered output voltage $V_{OUT}$ through the loop filter 210 into the bit signal $D_{OUT}$ depending on the sampling frequency $f_s$. Herein, the sampling frequency $f_s$ may be the same as the RRL operating frequency $f_{RRL}$.

At this time, the digital-to-analog converter 230 may convert the bit signal $D_{OUT}$ output through the quantizer 220 into an analog signal and may feed the analog signal back to the input terminal of the first amplifier 121. Herein, the output side of the digital-to-analog converter 230 may be electrically connected between the first amplifier 121 and the first capacitor $C_1$, and the input side of the digital-to-analog converter 230 may be electrically connected to the quantizer 220.

This inventive concept has been described with reference to one embodiment shown in the drawings, but this is only exemplary, and it will be understood that various modifications and other equivalent embodiments are possible from this point by those skilled in the art. The technical protection scope of the inventive concept will be defined by the technical spirit of the appended claims.

According to an embodiment of the inventive concept, a capacitively coupled continuous-time delta-sigma modulator may remove ripple according to instrumentation amplification while reducing frequency noise.

Furthermore, it is possible to reduce the noise peaking of NTF while preventing quantization noise demodulation of a delta-sigma modulator, which is generated by removing ripple.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A capacitively coupled continuous-time delta-sigma modulator comprising:
   an instrumentation amplifier configured to amplify an input voltage to generate an output voltage of a predetermined magnitude;
   a delta-sigma modulator configured to:
      output a bit signal quantized depending on a sampling frequency based on the output voltage; and
      convert the bit signal into a digital-to-analog conversion voltage which is fed back to the instrumentation amplifier; and
   a ripple reduction loop (RRL) unit configured to:
      generate a demodulation voltage based on the output voltage, in which a ripple is removed from the output voltage, depending on an RRL operating frequency; and
      feed the demodulation voltage back to the instrumentation amplifier,
   wherein the RRL operating frequency is equal to the sampling frequency.

2. The capacitively coupled continuous-time delta-sigma modulator of claim 1, wherein the instrumentation amplifier includes:
   a first modulator configured to modulate the input voltage depending on a modulation frequency equal to the sampling frequency;
   a second modulator configured to modulate at least one of an output of the first modulator and the demodulation voltage depending on the modulation frequency; and
   a third modulator configured to modulate the output voltage depending on the modulation frequency.

3. The capacitively coupled continuous-time delta-sigma modulator of claim 2, wherein the ripple reduction loop unit feeds the demodulation voltage back to the second modulator.

4. The capacitively coupled continuous-time delta-sigma modulator of claim 2, wherein the instrumentation amplifier further includes:
   a first amplifier, of which an input terminal is electrically connected to a first capacitor coupled to the first modulator; and
   a second amplifier, of which an input terminal is connected to the second modulator and of which an output terminal is connected to a second capacitor,
   wherein the input terminal of the second amplifier and the output terminal of the second amplifier are electrically connected through the second capacitor, and
   wherein the output terminal of the second amplifier is electrically connected to the input terminal of the first amplifier through a third capacitor coupled to the third modulator.

5. The capacitively coupled continuous-time delta-sigma modulator of claim 4, wherein the delta-sigma modulator includes:
   a loop filter connected to the output terminal of the second amplifier and configured to perform low pass filtering on the output voltage depending on a preset loop transfer function;
   a quantizer configured to quantize the low-pass-filtered output voltage as the bit signal; and
   a digital-to-analog converter configured to convert the bit signal into the digital-to-analog conversion voltage to feed the digital-to-analog conversion voltage back to the input terminal of the first amplifier.

6. The capacitively coupled continuous-time delta-sigma modulator of claim 5, wherein the preset loop transfer function includes a gain value corresponding to NULL for each sampling frequency.

7. The capacitively coupled continuous-time delta-sigma modulator of claim 1, wherein the ripple reduction loop unit includes:
   a loop sensing capacitor configured to sense the output voltage;
   a ripple elimination demodulator configured to demodulate a charging voltage, which is charged through the loop sensing capacitor, as a first demodulation voltage depending on the RRL operating frequency;
   a ripple elimination inverting amplifier configured to invert and amplify the first demodulation voltage;
   a loop feedback capacitor configured to feed an output terminal of the ripple elimination inverting amplifier back to an inverting input terminal of the ripple elimination inverting amplifier; and
   a ripple elimination non-inverting amplifier configured to non-invert and amplify the inverted and amplified first demodulation voltage as the demodulation voltage depending on a transconductance,
   wherein the inverted and amplified first demodulation voltage is non-inverted and amplified as the demodulation voltage depending on the transconductance of the ripple elimination non-inverting amplifier.

8. The capacitively coupled continuous-time delta-sigma modulator of claim 7, wherein a capacitance of the loop sensing capacitor is preset to a value reduced at a first decrease ratio based on a preset target increase ratio of a signal-to-noise ratio.

9. The capacitively coupled continuous-time delta-sigma modulator of claim 8, wherein the transconductance is preset to a value reduced at a second decrease ratio based on the preset target increase ratio of the signal-to-noise ratio, and
   wherein the second decrease ratio is less than the first decrease ratio.

10. An operation method of a capacitively coupled continuous-time delta-sigma modulator, the method comprising:
    amplifying, by an instrumentation amplifier, an input voltage to generate an output voltage of a predetermined magnitude;
    outputting, by a delta-sigma modulator, a bit signal quantized depending on a sampling frequency based on the output voltage;
    converting, by the delta-sigma modulator, the bit signal into a digital-to-analog conversion voltage which is fed back to the instrumental amplifier;
    generating, by a ripple reduction loop (RRL) unit, a demodulation voltage based on the output voltage, in which a ripple is removed from the output voltage, depending on an RRL operating frequency equal to the sampling frequency; and
    feeding, by the RRL unit, the demodulation voltage generated based on the output voltage back to the instrumentation amplifier.

11. A capacitively coupled continuous-time delta-sigma modulator comprising:
    an instrumentation amplifier configured to amplify an input voltage to generate an output voltage of a predetermined magnitude;
    a delta-sigma modulator configured to output a bit signal quantized depending on a sampling frequency based on the output voltage, and convert the bit signal into a digital-to-analog conversion voltage; and a ripple reduction loop (RRL) unit configured to generate a demodulation voltage, in which a ripple is removed from the output voltage, depending on an RRL operating frequency equal to the sampling frequency, and feed the demodulation voltage back to the instrumentation amplifier, wherein the instrumentation amplifier comprises:
 a first modulator configured to modulate the input voltage depending on a modulation frequency equal to the sampling frequency;
 a second modulator configured to modulate at least one of an output of the first modulator and the demodulation voltage depending on the modulation frequency; and
 a third modulator configured to modulate the output voltage depending on the modulation frequency.

12. The capacitively coupled continuous-time delta-sigma modulator of claim 11, wherein the RRL unit feeds the demodulation voltage back to the second modulator.

13. The capacitively coupled continuous-time delta-sigma modulator of claim 11, wherein the RRL unit comprises:
 a loop sensing capacitor configured to sense the output voltage;
 a ripple elimination demodulator configured to demodulate a charging voltage which is charged through the loop sensing capacitor as a first demodulation voltage depending on the RRL operating frequency;
 a ripple elimination inverting amplifier configured to invert and amplify the first demodulation voltage;
 a loop feedback capacitor configured to feed an output terminal of the ripple elimination inverting amplifier back to an inverting input terminal of the ripple elimination inverting amplifier; and
 a ripple elimination non-inverting amplifier configured to non-invert and amplify the inverted and amplified first demodulation voltage as the demodulation voltage depending on a transconductance,
 wherein the inverted and amplified first demodulation voltage is non-inverted and amplified as the demodulation voltage depending on the transconductance of the ripple elimination non-inverting amplifier.

14. The capacitively coupled continuous-time delta-sigma modulator of claim 13, wherein a capacitance of the loop sensing capacitor is preset to a value reduced at a first decrease ratio based on a preset target increase ratio of a signal-to-noise ratio.

15. The capacitively coupled continuous-time delta-sigma modulator of claim 13, wherein the transconductance is preset to a value reduced at a second decrease ratio based on the preset target increase ratio of the signal-to-noise ratio, and wherein the second decrease ratio is less than the first decrease ratio.

16. The capacitively coupled continuous-time delta-sigma modulator of claim 11, wherein the instrumentation amplifier further comprises:
 a first amplifier, of which an input terminal is electrically connected to a first capacitor coupled to the first modulator; and
 a second amplifier, of which an input terminal is connected to the second modulator and of which an output terminal is connected to a second capacitor,
 wherein the input terminal of the second amplifier and the output terminal of the second amplifier are electrically connected through the second capacitor, and
 wherein the output terminal of the second amplifier is electrically connected to the input terminal of the first amplifier through a third capacitor coupled to the third modulator.

17. The capacitively coupled continuous-time delta-sigma modulator of claim 16, wherein the delta-sigma modulator comprises:
 a loop filter connected to the output terminal of the second amplifier and configured to perform low pass filtering on the output voltage depending on a preset loop transfer function;
 a quantizer configured to quantize the low-pass-filtered output voltage as the bit signal; and
 a digital-to-analog converter configured to convert the bit signal into the digital-to-analog conversion voltage to feed the digital-to-analog conversion voltage back to the input terminal of the first amplifier.

18. The capacitively coupled continuous-time delta-sigma modulator of claim 17, wherein the preset loop transfer function comprises a gain value corresponding to NULL for each sampling frequency.

* * * * *